United States Patent
Takeda et al.

(10) Patent No.: US 8,587,097 B2
(45) Date of Patent: Nov. 19, 2013

(54) SEMICONDUCTOR DEVICE THAT SUPPRESSES MALFUNCTIONS DUE TO NOISE GENERATED IN INTERNAL CIRCUIT

(75) Inventors: Hiromasa Takeda, Tokyo (JP); Satoshi Isa, Tokyo (JP); Shotaro Kobayashi, Tokyo (JP); Mitsuaki Katagiri, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 610 days.

(21) Appl. No.: 12/787,873

(22) Filed: May 26, 2010

(65) Prior Publication Data

US 2010/0314779 A1    Dec. 16, 2010

(30) Foreign Application Priority Data

Jun. 11, 2009  (JP) .................................. 2009-140366

(51) Int. Cl.
- *H01L 27/118* (2006.01)
- *H01L 23/58* (2006.01)
- *H01L 29/40* (2006.01)

(52) U.S. Cl.
USPC ............................. 257/665; 257/206; 257/778

(58) Field of Classification Search
USPC ............................ 257/206, 207, 208, 665.778
See application file for complete search history.

(56) References Cited

U.S. PATENT DOCUMENTS

| | | | |
|---|---|---|---|
| 6,181,005 B1 * | 1/2001 | Arimoto | 257/691 |
| 6,441,448 B1 * | 8/2002 | Maeda et al. | 257/392 |
| 7,214,566 B1 | 5/2007 | Wood et al. | |
| 7,323,772 B2 | 1/2008 | Morrison | |
| 2004/0113250 A1 | 6/2004 | Khandros et al. | |
| 2009/0032973 A1 | 2/2009 | Sasaki et al. | |
| 2010/0123226 A1 * | 5/2010 | Chen et al. | 257/670 |

FOREIGN PATENT DOCUMENTS

| | | |
|---|---|---|
| JP | 2008-198841 A | 8/2008 |
| JP | 2009-38142 A | 2/2009 |

OTHER PUBLICATIONS

USPTO, Office Action, U.S. Appl. No. 13/014,235, Jun. 18, 2012, 18 pages.

* cited by examiner

*Primary Examiner* — James Mitchell
(74) *Attorney, Agent, or Firm* — Foley & Lardner LLP

(57) ABSTRACT

A semiconductor device includes a first pad row and a second pad row, a first ground potential supply electrode which is connected to a first interconnect provided near the first pad row, and a second ground potential supply electrode which is connected to a second interconnect provided near the second pad row. The first pad row includes a first pad connected to the first circuit within the chip and connected to the first interconnect via a first bonding wire, and includes a second pad connected to a second circuit within the chip and connected to the second interconnect via a second bonding wire crossing over the second pad row.

19 Claims, 4 Drawing Sheets

US 8,587,097 B2

SEMICONDUCTOR DEVICE THAT SUPPRESSES MALFUNCTIONS DUE TO NOISE GENERATED IN INTERNAL CIRCUIT

This application is based upon and claims the benefit of priority from Japanese Patent Application No. 2009-140366 filed on Jun. 11, 2009, the content of which is incorporated by reference.

BACKGROUND OF THE INVENTION

1. Field of the Invention

The present invention relates to a semiconductor device.

2. Description of the Related Art

In recent years, concerning the DRAM (dynamic random access memory) which is an example of a semiconductor device, pads for electrically connecting an internal circuit to the outer part of a chip, and that are arranged in a center part of the chip, have been attracting attention. An example of such DRAMs is disclosed in JP2009-038142A.

A plurality of pads, such as a data input/output (DQ) pad, an address pad, a control pad, a power supply voltage (VDD) pad and a ground potential (VSS) pad, are usually provided respectively according to the purpose of each of the plurality of pads. Hereinafter, a configuration in which a plurality of pads are arranged in a row in a certain direction is called as "pad row".

The semiconductor chip disclosed in JP2009-038142A is an example in which one pad row is adopted. In such chips as described above, research has conducted into cases in which two parallel pad rows are arranged in the center part of the chip in response to an increase in the number of DQ pads.

On the other hand, to adapt to various products on which a DRAM is to be mounted, DRAMs are provided mainly in three product types, "×8", "×16" and "×32", in terms of the number of data inputs/outputs. For this reason, research has been conducted into cases in which pad rows, which can adapt to any of 8 DQ pads (a case where the number of data inputs/outputs is "×8"), 16 DQ pads (a case where the number of data inputs/outputs is "×16") and 32 DQ pads (a case where the number of data inputs/outputs is "×32"), are used. As an example, there is a method as described below. When a chip in which 32 DQ pads are arranged to be adaptable to DQ pads, whose number of data inputs/outputs is "×32", which is the number at which the number of DQ pads reaches a maximum, is fabricated and shipped to customers with the number of data inputs/outputs of "×16" or "×8", the three product types with different numbers of data inputs/outputs are realized with one kind of common chip in such a manner as to ensure that unnecessary DQ pads are not connected to a printed circuit board.

An example of the configuration of the BGA (ball grid array) of a DRAM chip provided with two pad rows will be described with reference to a drawing. It is assumed that the chip to be mounted on this BGA is a common chip adaptable to any of the numbers of data inputs/outputs "×8", "×16", and "×32".

For pads formed on the DRAM chip, there are DQ pads for performing data input/output and CA pads for receiving command signals and address signals, as pads associated with signal input/output. The CA pads are arranged in a center part of the DRAM chip to be adaptable to the three product types with different numbers of data inputs/outputs. Pads for 8 bits, for "×8", and for the remaining 8 bits used in "×16", in addition to the 8 bits, are arranged in one section of the CA pads of the chip, and pads for the remaining 16 bits used in "×32" are arranged in another section of the CA pads. In other words, the DQ pads are arranged so as to be sandwiched by the pads for 16 bits used in "×16" and the pads for the remaining 16 bits used in "×32" in the direction of the long side of the chip.

FIG. 1 is a perspective view showing an example of the configuration of a related semiconductor device.

As shown in FIG. 1, chip 302 is provided on package 301. FIG. 1 shows an enlarged portion corresponding up to approximately ⅓ of package 301 from one of the two short sides of package 301 on which rectangular chip 302 is mounted.

On a surface of package 301, there are provided electrode pads for solder balls for electrically connecting package 301 and a printed circuit board on which this package 301 is to be mounted. The positions of the electrode pads for solder balls are specified in standards such as DDR2 (double data rate 2) and DDR3. VDD electrodes 151 and 152 are electrode pads for solder balls for supplying a power supply voltage to chip 302. VSS electrodes 153 and 154 are electrode pads for solder balls for supplying a ground potential to chip 302. Address input electrode 171 is an electrode pad for a solder ball to which signals for specifying each of addresses A0 to A12 and BA0 to BA2 are inputted. FIG. 1 is a perspective view obtained when package 301 is viewed from the surface on the side where solder balls are attached.

Two pad rows are provided in the center part of chip 302 parallel to the long side of chip 302. Pads 111, 112 and 116 (hereinafter referred to as VSSSA pads) are sense amplifier grounding pads which supply a ground potential to sense amplifiers. Pad 113 (hereinafter referred to as a VSSP pad) is a pad for supplying a ground potential to a power-up voltage generating circuit. Pad 114 (hereinafter referred to as a VSSI pad) is a pad for supplying a ground potential to an input first-stage circuit. In particular, an input first-stage circuit is apt to be affected by noise because the input first-stage circuit detects small potential differences.

Pad 122 (hereinafter referred to as a VDDSA pad) is a sense amplifier power supply pad for supplying a power supply voltage to a sense amplifier. Pad 121 (hereinafter referred to as a VDDP pad) is a pad for supplying a power supply voltage to the power-up voltage generating circuit. Pads 123 and 124 (hereinafter referred to as VDDI pads) are pads for supplying a power supply voltage to the input first-stage circuit.

Interconnects are provided from the electrode pads for solder balls near to the pad rows, and the pads of the pad rows and the interconnects are connected by bonding wires 391. VSSSA pads 111 and 112, VSSP pad 113, and VSSI pad 114 are connected to VSS electrode 153 via bonding wires 391 and VSS interconnect 363. VSSI pad 115 and VSSSA pad 116 are connected to VSS electrode 154 via bonding wires 391 and VSS interconnect 364.

VDDP pad 121, VDDSA pad 122, and VDDI pads 123 and 124 are connected to VDD electrodes 151 and 152 via bonding wires 391 and VDD interconnect 361.

Incidentally, in FIG. 1, the case where the number of data inputs/outputs is "×32" is shown for the connection of each of various pads 111 to 116 and 121 to 124 and the VSS interconnects or the VDD interconnects. For other pads, part of the case where the number of data inputs/outputs is "×8" or "×16" is shown.

In package 301 shown in FIG. 1, in a case where there are a plurality of pads connected to the same potential in one of the two pad rows on the left side and the right side, the plurality of pads are connected to the electrodes for solder balls via the interconnects on the side near the pad row. A specific example will be described with reference to FIG. 1. VSSSA pads 111 and 112, VSSP pad 113, and VSSI pad 114 in the pad row on the left side are connected to VSS electrode 153 via VSS interconnect 363. VSSI pad 115 and VSSSA pad 116 in the pad row on the right side are connected to VSS electrode 154 via VSS interconnect 364.

As described above, in the configuration shown in FIG. 1, in a case where a ground potential VSSSA pad and a VSSI pad are provided in the same pad row, each of these pads is commonly connected to a VSS interconnect which is nearest to each pad.

However, noise may sometimes be generated in a VSSSA pad due to variations in the potential within a sense amplifier while the sense amplifier is working. In this case, in the configuration shown in FIG. 1, noise reaches the VSSI pad from the VSSSA pad via the VSS interconnect and is superimposed on the VSSI pad and therefore it becomes necessary to reduce the operating frequency in order to ensure that the input first-stage can receive input data without an error even under the influence of the noise. This causes a worsening of the operating characteristics (concretely, the operating frequency) of the chip.

SUMMARY

In one embodiment, there is provided a semiconductor device that includes a first pad row and a second pad row, a first ground potential supply electrode which is connected to a first interconnect provided near the first pad row, and a second ground potential supply electrode which is connected to a second interconnect provided near the second pad row, and wherein the first pad row includes a first pad connected to the first circuit within the chip and connected to the first interconnect via a first bonding wire, and includes a second pad connected to a second circuit within the chip and connected to the second interconnect via a second bonding wire crossing over the second pad row.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The configuration of the semiconductor device of this exemplary embodiment will be described. First, a description will be given of the configuration of a semiconductor chip which will be mounted on the semiconductor device of this exemplary embodiment.

Figure 2:
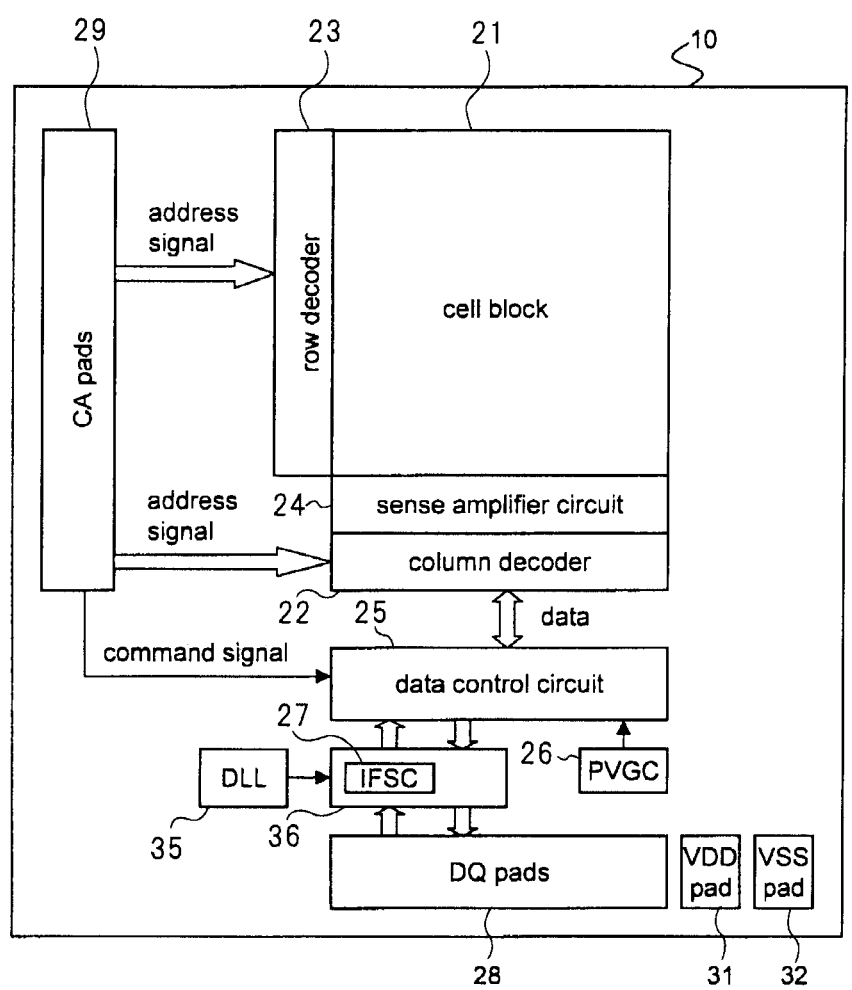
FIG. 2 is a block diagram showing a configuration of a semiconductor chip which will be mounted on a semiconductor device of an exemplary embodiment.

FIG. 2 is a block diagram showing a configuration of a semiconductor chip which will be mounted on the semiconductor device of this exemplary embodiment.

Semiconductor chip 10 in this exemplary embodiment comprises cell block 21 which includes a plurality of memory cells, column decoder 22, row decoder 23, sense amplifier circuit 24, data control circuit 25, and power-up voltage generating circuit 26 (PVGC in FIG. 2). Input and output buffer 36 which includes input first-stage circuit 27 (IFSC in FIG. 2), is provided between DQ pads 28 and data control circuit 25. DLL (delay locked Loop) 35 is connected to input and output buffer 36 and adjusts timings of input and output of data according to a reference clock signal. A plurality of cell blocks may be provided in the semiconductor chip 10.

A power supply voltage from an external via VDD pad 31 is supplied to an internal circuit which includes above-described circuits and this internal circuit is connected to a ground potential via VSS pad 32. A plurality of VDD pads are provided in semiconductor chip 10 and a plurality of VSS pads are provided in semiconductor chip 10. Power-up voltage generating circuit 26 generates a voltage larger than the power supply voltage and supplies the generated voltage to data control circuit 25.

Column decoder 22 and row decoder 23 specify one memory cell within cell block 21 according to address signals inputted via CA pads. Sense amplifier circuit 24 detects a potential voltage corresponding to a charge stored in the specified memory cell and amplifies the potential voltage. Data control circuit 25 controls processes of sending and receiving data which are inputted and outputted via DQ pads 28.

Figure 3:
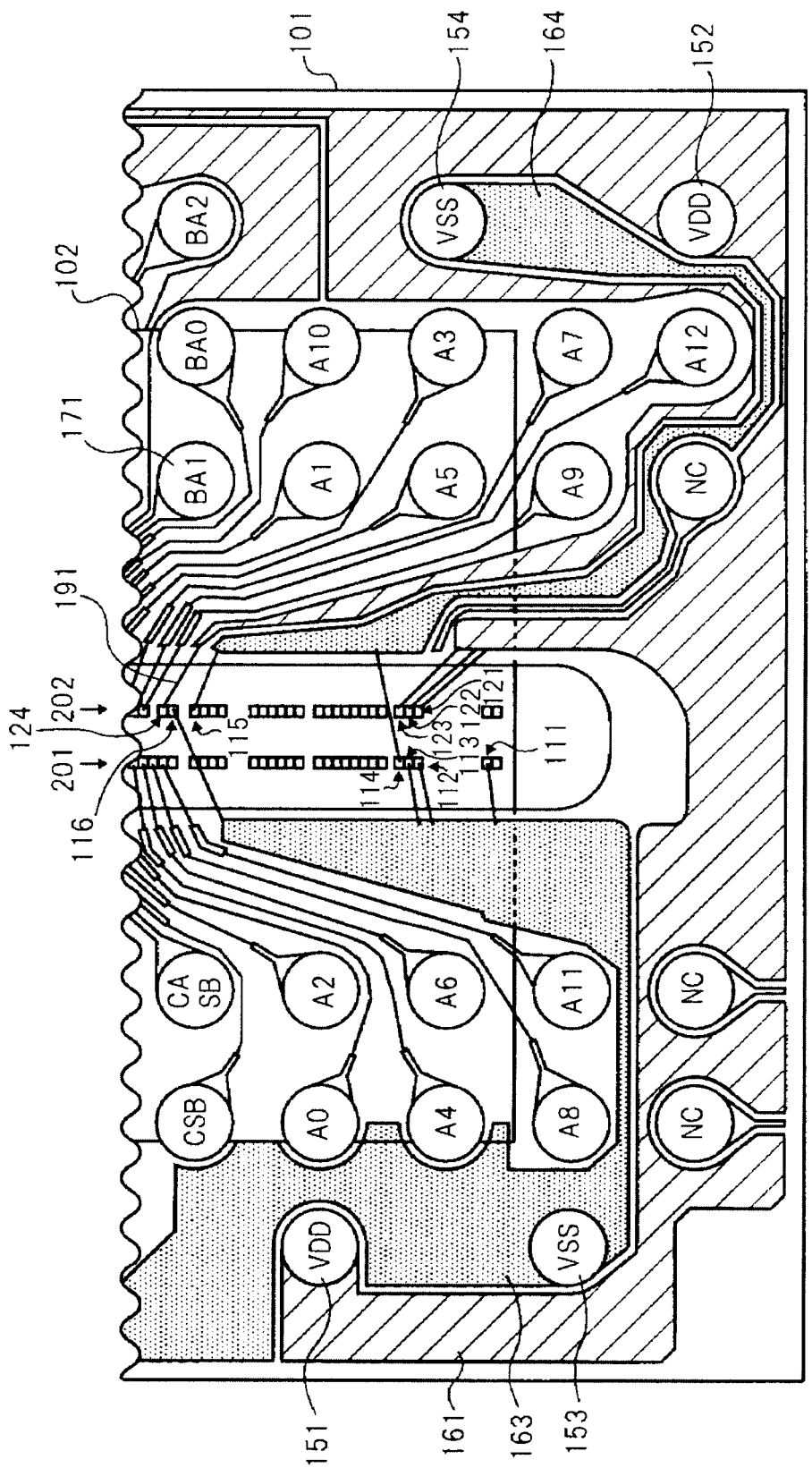
FIG. 3 is perspective view showing an example of the configuration of a semiconductor device of this exemplary embodiment.

FIG. 3 is perspective view showing an example of the configuration of a semiconductor device of this exemplary embodiment. The semiconductor device shown in FIG. 3 is configured to include semiconductor chip 10, and here semiconductor chip 10 is DRAM chip 102.

Figure 1:
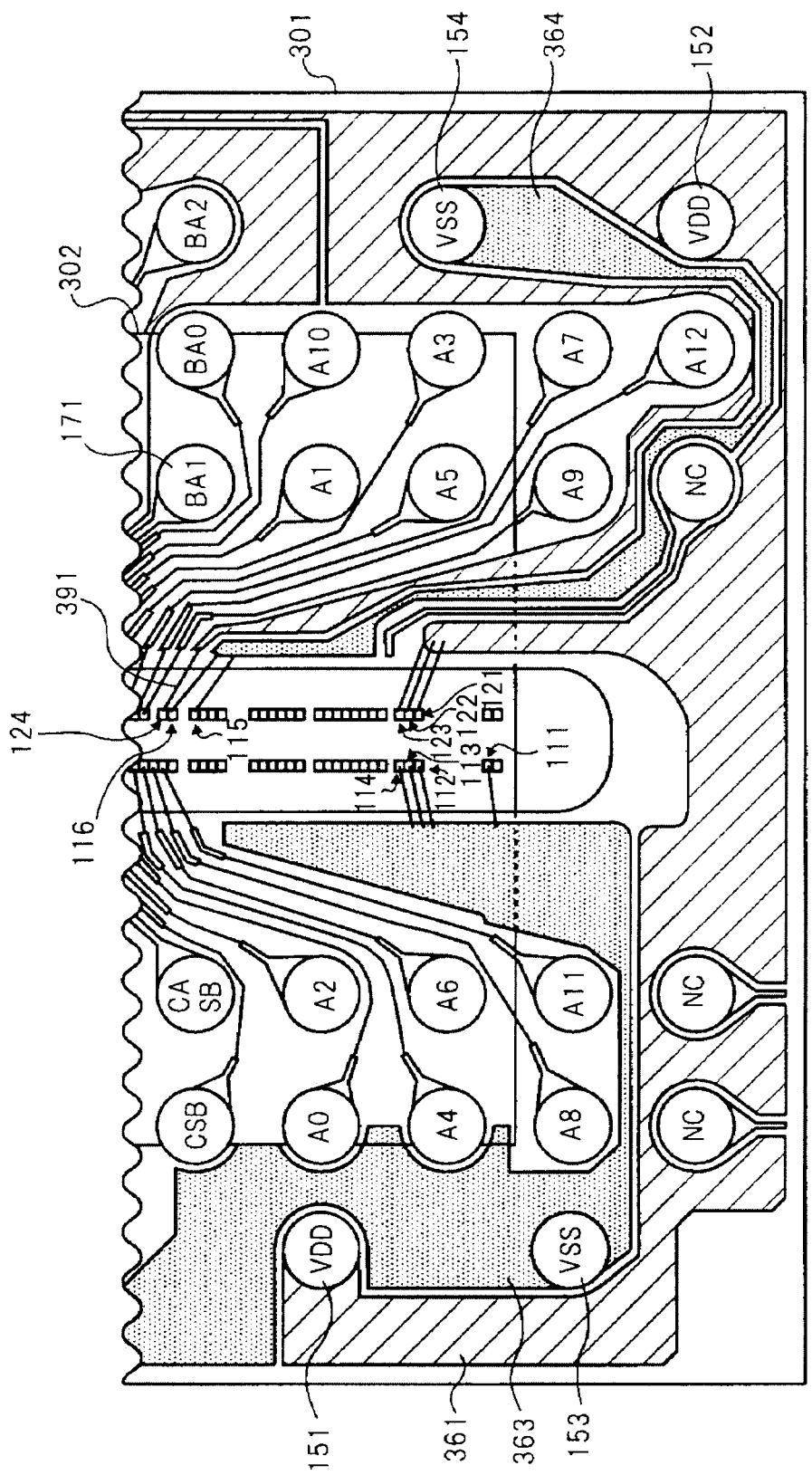
FIG. 1 is a perspective view showing an example of the configuration of a related semiconductor device.

As shown in FIG. 3, DRAM chip 102 is provided in BGA package 101. Like FIG. 1, also FIG. 3 shows an enlarged portion corresponding up to approximately ⅓ of package 101 from one of the two short sides of package 101 on which rectangular chip 102 is mounted.

Also, FIG. 3 is a perspective view obtained when package 101 is viewed from the surface on the side where solder balls are attached. It is assumed that the chip shown in FIG. 3 is a common chip adaptable to any of the numbers of data inputs/outputs "×8", "×16", and "×32". Here it is assumed that a common chip is used when the number of data inputs/outputs is "×8" or "×16". In the following, components like those described in FIG. 1 have like symbols and detailed descriptions of such components are omitted.

As shown in FIG. 3, on a surface of the package 101, there are provided electrode pads for solder balls including VDD electrodes 151 and 152 for electrically connecting package 101 and a printed circuit board on which this package 101 is to be mounted, VSS electrodes 153 and 154, and address input electrode 171. The positions of these electrode pads for solder balls are specified in standards such as DDR2 and DDR3.

Two pad rows 201 and 202 are provided in the center part of chip 102 parallel to the long side of chip 102. Among the two pad rows shown in FIG. 3, pad row 201 on the left side includes VSSSA pads 111 and 112, VSSP pad 113, and VSSI pad 114. Pad row 202 on the right side includes VDDP pad 121, VDDSA pad 122, VDDI pad 123, VSSI pad 115, VSSSA pad 116, and VDDI pad 124.

Interconnects are provided from the electrode pads for solder balls near to the pad rows, and the pads of the pad rows and the interconnects are connected by bonding wires 191. As shown in FIG. 3, VSS interconnect 163 is provided on the side nearer to pad row 201 than to pad row 202, and VSS interconnect 164 is provided on the side nearer to pad row 202 than to pad row 201. VSS interconnect 163 is connected to VSS electrode 153, and VSS interconnect 164 is connected to VSS electrode 154. VDD interconnect 161 is connected to VDD electrodes 151 and 152.

As shown in FIG. 3, in this exemplary embodiment, each of VSSSA pads 111 and 112 and VSSP pad 113 of pad row 201 and VSSSA pad 116 of pad row 202 is connected to VSS interconnect 163 via bonding wires 191. VSSI pad 114 of pad row 201 and VSSI pad 115 of pad row 202 are connected to VSS interconnect 164 via bonding wires 191 respectively.

VDDP pad 121, VDDSA pad 122 and VDDI pads 123 and 124 of pad row 202 are connected to VDD interconnect 161 via bonding wires 191. The reason why each of VSS interconnects 163 and 164 and VDD interconnect 161 has a solid pattern with a wide area is that the interconnect width is thereby made as wide as possible and that the current channels between the pads of the pad rows and the electrode pads for solder balls are thereby made as short as possible.

In this exemplary embodiment, in using a chip having a DQ pad with data inputs/outputs of "×32" as a product of "×16" or a product of "×8", the bonding wires are caused to pass over a pad which becomes a non-connection pad, whereby a VSSI pad and a VSSSA pad, to both of which a ground potential is supplied, are each separately connected to a ground potential supply electrode. For this reason, it becomes possible prevent the noise generated in the sense amplifier circuit from reaching the VSSI pad from the VSSSA pad via the VSS interconnect and to provide a chip whose operating speed is improved.

When the chip is used as a product of "×16", the pads which become non-connection pads are a DQ pad, a DQS pad associated with the DQ pad, a VDDQ pad which supplies a power supply voltage to a DQ input/output circuit and a VSSQ pad which supplies a ground potential to the DQ input/output circuit, that are only used in a product of "×32".

A pad connected to a circuit having high noise immunity, or a pad connected to a circuit in which noise is apt to be generated, and a pad connected to a circuit having low noise immunity are each separately connected to a ground potential supply electrode, whereby a circuit that is considered to provide a noise generation source, and a circuit having low noise immunity, are isolated from each other and it is possible to prevent malfunctions from occurring in a circuit within the chip.

Incidentally, although FIG. 3 shows the case where the bonding wires are caused to pass over pads that are not in use, the bonding wires may be caused to pass over the space between the pads.

Figure 4:
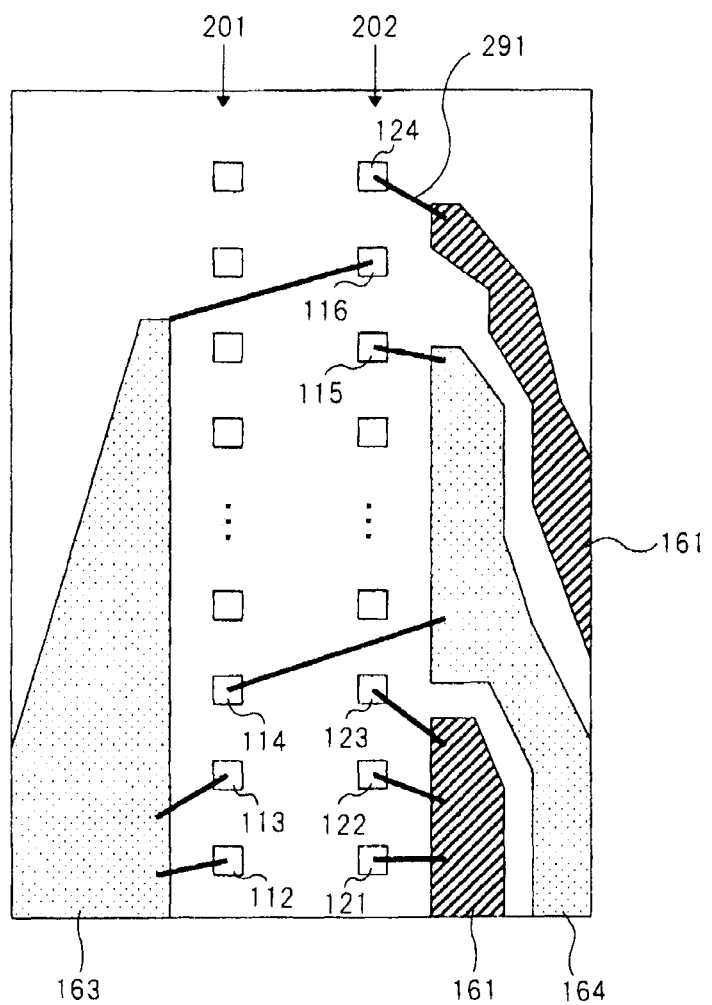
FIG. 4 is a plan view showing the main part of another example of the configuration of a semiconductor device of this exemplary embodiment.

FIG. 4 is a plan view showing the main part of another example of the configuration of a semiconductor device of this exemplary embodiment. As shown in FIG. 4, if there is a margin of the region where pads are arranged, the gap between the pads may be made wide. Bonding wire 291 which connects VSS interconnect 163 and VSSSA pad 116 crosses over pad row 201 and passes over the space between pads of pad row 201. Bonding wire 291 which connects VSS interconnect 164 and VSSSA pad 114 crosses over pad row 202 and passes over the space between pads of pad row 202.

The gap between the pads is made wider than in the case shown in FIG. 3 like this, whereby bonding wire 291 which crosses over a pad row passes over the space between two pads without passing over the pad. This also makes it possible to connect these two pads to interconnect via bonding wires. For this reason, by applying the present invention to a product type whose number of data inputs/outputs is "×32", it becomes possible to prevent noise from flowing from a sense amplifier circuit to other circuits via a VSS interconnect and to improve the operating frequency.

Although in this exemplary embodiment a description was given of the case where the sense amplifier circuit is a noise generation source, a power-up voltage generating circuit can also be a noise generation source. It is possible to apply the present invention to a power-up voltage generating circuit, a circuit including a power-up voltage generating circuit, and a circuit whose noise immunity is lower than a power-up voltage generating circuit.

A comparison between a power-up voltage generating circuit and a sense amplifier circuit concerning noise immunity reveals that noise immunity of the sense amplifier circuit is lower than the noise immunity of the power-up voltage generating circuit. For this reason, it is also possible to apply the present invention to these circuits. Although in this exemplary embodiment the description was given of the case where a circuit whose noise immunity is low, is the input first-stage circuit, it is also possible to apply the present invention to a DLL circuit. Also, even when noise is superimposed on either a VDD pad or a VSS pad with a reference potential voltage in which the power supply voltage is a reference, this exerts an adverse effect on the device, and hence it is also possible to apply the present invention also to these pads as pads connected to circuits whose noise immunity is low.

Furthermore, although in the semiconductor device of this exemplary embodiment the description was given of the case in which the semiconductor chip is a DRAM, the semiconductor chip is not limited to a DRAM and may be other memory devices. Moreover, when it is necessary to connect a separate ground potential supply electrode to each circuit whose noise immunity is high and to each circuit whose noise immunity is low, it is possible to apply the present invention also to a logic device in addition to a memory device.

According to this exemplary embodiment, the first pad connected to the first circuit and the second pad connected to the second circuit are provided in the first pad row, the first pad being connected to the first ground potential supply electrode and the second pad being connected to the second ground potential supply electrode. For this reason, noise generated in either the first circuit or the second circuit will not flow to the other circuit via the first or second interconnect.

According to this exemplary embodiment, two ground potential supply pads connected to different circuits are each connected to different ground potential supply electrodes, and therefore it is possible to prevent the noise generated in either of the circuits from exerting an adverse effect on the other circuit.

It is apparent that the present invention is not limited to the above embodiments, but may be modified and changed without departing from the scope and spirit of the invention.

What is claimed is:
1. A semiconductor device comprising:
a first pad row and a second pad row which are provided on a surface of a chip, and in both the first pad row and the second pad row a plurality of pads which are connected to a circuit within the chip are arranged along a certain direction;
a first ground potential electrode which is connected to a first wiring provided nearer to the first pad row than to the second pad row; and a second ground potential electrode which is connected to a second wiring provided nearer to the second pad row than to the first pad row,
wherein the first pad row includes a first pad and a second pad,
wherein the first pad is connected to a first circuit within the chip and connected to the first wiring via a first bonding wire, and
wherein the second pad is connected to a second circuit within the chip and connected to the second wiring via a second bonding wire crossing over the second pad row.

2. The semiconductor device according to claim 1, wherein the second bonding wire is arranged so as to pass over a pad of the second pad row.

3. The semiconductor device according to claim 2, wherein a pad in the second pad row over which the second bonding wire passes, is a non-connection pad.

4. The semiconductor device according to claim 1, wherein the first pad row and the second pad row are each arranged in a center part of the chip in parallel straight lines along a longitudinal direction of the chip.

5. The semiconductor device according to claim 1, wherein the second bonding wire passes over space between pads of the second pad row.

6. The semiconductor device according to claim 1, wherein either the first circuit or the second circuit is a noise generation source.

7. The semiconductor device according to claim 1, wherein noise immunity of the first circuit is different from noise immunity of the second circuit.

8. The semiconductor device according to claim 1, wherein the first or second circuit is a sense amplifier circuit and the other circuit is an input first-stage circuit.

9. The semiconductor device according to claim 1, wherein the first or second circuit is a power-up voltage generating circuit and the other circuit is an input first-stage circuit or a sense amplifier circuit.

10. The semiconductor device according to claim 1, wherein the first ground potential electrode supplies the first wiring with a ground potential, and the second ground potential electrode supplies the second wiring with the ground potential.

11. The semiconductor device according to claim 1, wherein the second wiring is separated from the first pad row and the second pad row.

12. A semiconductor device comprising:
a first pad row, including a plurality of pads, provided on a surface of a chip and arranged along a certain direction, the first pad row including a first pad coupled to a first circuit of the chip and a second pad coupled to a second circuit of the chip;
a second pad row, including a plurality of pads, provided on the surface of the chip and arranged along the certain direction,
a first ground potential electrode provided between the first pad row and a first edge of the chip nearer to the first pad row than the second pad row;
a second ground potential electrode provided between the second pad row and a second edge of the chip nearer to the second pad row than the second pad row, the second edge being opposite to the first edge;
a first connector connected between the first pad and the first ground potential electrode; and
a second connector connected between the second pad and the second ground potential electrode so as to cross the second pad row.

13. The semiconductor device according to claim 12, wherein the first pad row and the second pad row are each arranged in a center part of the chip in parallel straight lines along a longitudinal direction of the chip.

14. The semiconductor device according to claim 12, wherein the second connector wire passes through space between pads of the second pad row.

15. The semiconductor device according to claim 12, wherein noise immunity of the first circuit is different from noise immunity of the second circuit.

16. The semiconductor device according to claim 12, wherein the first or second circuit is a sense amplifier circuit and the other circuit is an input first-stage circuit.

17. The semiconductor device according to claim 12, wherein the first or second circuit is a power-up voltage generating circuit and the other circuit is an input first-stage circuit or a sense amplifier circuit.

18. The semiconductor device according to claim 12, wherein the first ground potential electrode supplies the first connector with a ground potential, and the second ground potential electrode supplies the second connector with the ground potential.

19. The semiconductor device according to claim 12, wherein the first and second ground potential electrodes are provided above the chip.

\* \* \* \* \*